US 6,713,759 B2

(12) United States Patent
Adler et al.

(10) Patent No.: US 6,713,759 B2
(45) Date of Patent: Mar. 30, 2004

(54) APPARATUS AND METHOD FOR SECONDARY ELECTRON EMISSION MICROSCOPE

(75) Inventors: David L. Adler, San Jose, CA (US); David J. Walker, Sunol, CA (US); Fred Babian, Boulder Creek, CA (US); Travis Wolfe, Santa Clara, CA (US)

(73) Assignee: KLA Tencor Corporation, San Jose, CA (US)

( * ) Notice: Subject to any disclaimer, the term of this patent is extended or adjusted under 35 U.S.C. 154(b) by 0 days.

(21) Appl. No.: 10/033,452

(22) Filed: Nov. 2, 2001

(65) Prior Publication Data

US 2002/0104964 A1 Aug. 8, 2002

Related U.S. Application Data

(60) Continuation of application No. 09/613,985, filed on Jul. 11, 2000, now abandoned, which is a continuation of application No. 09/354,948, filed on Jul. 16, 1999, now Pat. No. 6,087,659, which is a division of application No. 08/964,544, filed on Nov. 5, 1997, now Pat. No. 5,973,323.

(51) Int. Cl.[7] ............................................. H01J 37/244
(52) U.S. Cl. ........................................ 250/307; 350/307
(58) Field of Search ................................ 250/310, 307, 250/330, 397

(56) References Cited

U.S. PATENT DOCUMENTS

| 4,472,631 A | * | 9/1984 | Enke et al. ................. 250/281 |
| 4,686,566 A | * | 8/1987 | Butcher ....................... 250/334 |
| 4,877,326 A | * | 10/1989 | Chadwick et al. .......... 356/394 |
| 5,144,149 A | * | 9/1992 | Frosch ........................ 250/330 |
| 5,302,828 A | * | 4/1994 | Monahan ..................... 250/307 |

OTHER PUBLICATIONS

"The Continuing Development of Low–energy Elecctron Microscopy for Characterizing Surfaces", Vencklen, Rev. Sci. Instruments 63 (12), pp 5513–5532, Dec. 1992.*

* cited by examiner

*Primary Examiner*—Bruce Anderson
(74) *Attorney, Agent, or Firm*—Carr & Ferrell LLP

(57) ABSTRACT

An apparatus and method for inspecting a surface of a sample, particularly but not limited to a semiconductor device, using an electron beam is presented. The technique is called Secondary Electron Emission Microscopy (SEEM), and has significant advantages over both Scanning Electron Microscopy (SEM) and Low Energy Electron Microscopy (LEEM) techniques. In particular, the SEEM technique utilizes a beam of relatively high-energy primary electrons having a beam width appropriate for parallel, multi-pixel imaging. The electron energy is near a charge-stable condition to achieve faster imaging than was previously attainable with SEM, and charge neutrality unattainable with LEEM. The emitted electrons may be detected using a time delay integration detector.

8 Claims, 8 Drawing Sheets

| | Photo-Electron Emission Microscopy | Low Energy Emission Microscopy | Low voltage Scanning Electron Microscopy | Secondary Electron Emission Microscopy |
| --- | --- | --- | --- | --- |
| | PEM | LEEM | SEM | SEEM |
| Incident Particles | Photons $h\nu = E_p >$ Binding Energy | Electrons ($e_1$) $0 < E_p^1 < 100 eV$ | Electrons | Electrons |
| Detected Particles | Photo-Electrons ($e_2$) | Reflected Electrons ($e_1$) | Secondary Electrons ($e_2$) | Secondary Electrons ($e_2$) |
| Imaging Method | Parallel Imaging | Parallel Imaging | Raster Scanning | Parallel Imaging |
| Charging | Charge Build Up (+) Positive | Charge Build Up (−) Negative | Limited Charging | Limited Charging |

*FIG. 3*

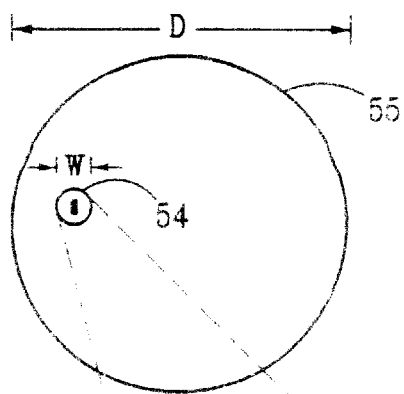
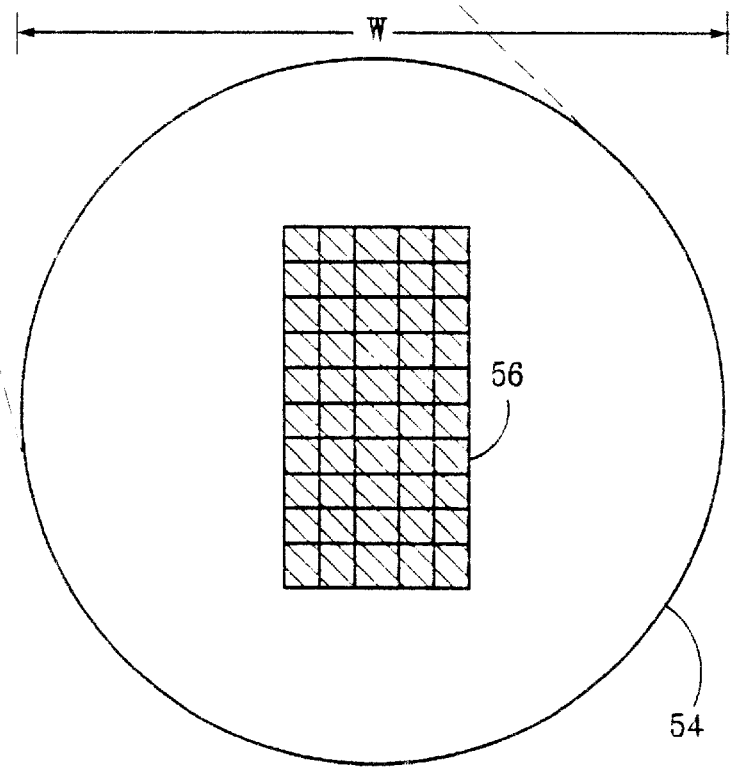
FIG. 5

APPARATUS AND METHOD FOR SECONDARY ELECTRON EMISSION MICROSCOPE

CROSS-REFERENCE TO RELATED APPLICATIONS

This is a continuation application of and claims priority in U.S. patent application Ser. No. 09/613,985 entitled APPARATUS AND METHOD FOR SECONDARY ELECTRON EMISSION MICROSCOPE, filed Jul. 11, 2000 now abandoned which is a continuation of U.S. patent application Ser. No. 09/354,948, entitled APPARATUS AND METHOD FOR SECONDARY ELECTRON EMISSION MICROSCOPE, filed Jul. 16, 1999, which will issue as U.S. Pat. No. 6,087,659 on Jul. 11, 2000, and which is a divisional application of U.S. patent application Ser. No. 08/964,544, entitled APPARATUS AND METHOD FOR SECONDARY ELECTRON EMISSION MICROSCOPE, filed Nov. 5, 1997 now U.S. Pat No. 5,973,323.

BACKGROUND OF THE INVENTION

1. Technical Field

The present invention relates generally to an apparatus and a method for using electron beams to microscopically inspect the surface of an object, and more particularly to inspect layers in a semiconductor device.

2. Discussion of the Prior Art

A variety of methods have been used to examine microscopic surface structures of semiconductors. These have important applications in the field of semiconductor chip fabrication, where microscopic defects at a surface layer make the difference between a good or bad chip. Holes or vias in an intermediate insulating layer often provide a physical conduit for an electrical connection between two outer conducting layers. If one of these holes or vias becomes clogged, it will be impossible to establish this electrical connection and the whole chip may fail. Examination of the microscopic defects in the surface of the semiconductor layers is necessary to ensure quality control of the chips.

Electron beams have several advantages over other mechanisms to examine samples. Light beams have an inherent resolution limit of about 100 nm–200 nm, but electron beams can investigate feature sizes as small as a few nanometers. Electron beams are manipulated fairly easily with electrostatic and electromagnetic elements, and are easier to produce and manipulate than x-rays.

Electron beams in semiconductor defect inspection do not produce as many false positives as optical beams. Optical beams are sensitive to problems of color noise and grain structures whereas electron beams are not. Oxide trenches and polysilicon lines are especially prone to false positives with optical beams due to grain structure.

A variety of approaches involving electron beams have been utilized for examining surface structure. In low-voltage scanning electron microscopy (SEM), a narrow beam of primary electrons is raster-scanned across the surface of a sample. Primary electrons in the scanning beam cause the sample surface to emit secondary electrons. Because the primary electrons in the beam of scanning electron microscopy are near a particular known electron energy (called '$E_2$'), there is no corresponding charge build-up problem in SEM, and the surface of the sample remains neutral. However, raster scanning a surface with scanning electron microscopy is slow because each pixel on the surface is collected sequentially. Moreover, a complex and expensive electron beam steering system is needed to control the beam pattern.

Another approach is called Photo-Electron Emission Microscopy (PEM or PEEM), in which photons are directed at the surface of a sample to be studied, and by the photoelectric effect, electrons are emitted from the surface. On an insulating surface, the emission of these electrons, however, produces a net positive charge on the sample surface since there is a net flux of electrons from the surface. The sample continues to charge positively until there are no emitted electrons, or electrical breakdown occurs. This charge build-up problem limits the utility of PEEM for imaging insulators.

Another method of examining surfaces with electron beams is known as Low Energy Electron Microscopy (LEEM), in which a relatively wide beam of low-energy electrons is directed to be incident upon the surface of the sample, and electrons reflected from the sample are detected. However, LEEM suffers from a similar charge build-up problem since electrons are directed at the sample surface, but not all of the electrons are energetic enough to leave the surface. In LEEM, negatively-charged electrons accumulate on the surface, which repels further electrons from striking the sample, resulting in distortions and shadowing of the surface.

Several prior art publications have discussed a variety of approaches using electron beams in microscopy, but none have determined how to do so with parallel imaging at the same time the charge build-up problem is eliminated. One of these approaches is described by Lee H. Veneklasen in "The Continuing Development of Low-Energy Electron Microscopy for Characterizing Surfaces," *Review of Scientific Instruments*, 63(12), December 1992, pages 5513 to 5532. Veneklasen notes generally that the LEEM electron potential difference between the source and sample can be adjusted between zero and a few keV, but he does not recognize the charging problem or propose a solution to it. Habliston et al., in "Photoelectron Imaging of Cells: Photoconductivity Extends the Range of Applicability," *Biophysical Journal*, Volume 69, October 1995, pages 1615 to 1624, describe a method of reducing sample charging in photoelectron imaging with ultraviolet light.

Thus, there remains a need for a method utilizing electrons beams to investigate sample surfaces that eliminates the charge build-up problem and increases the speed of examining large sample surfaces.

SUMMARY OF THE INVENTION

The present invention provides an improved apparatus and method, called Secondary Electron Emission Microscopy (SEEM), for using electron beams to inspect samples with electron beam microscopy. The apparatus images a large number of pixels in parallel on a detector array, and thereby has the properties of being faster and lower in noise than conventional Scanning Electron Microscopes. Electron beam scanning systems are not required, and the electron beam current densities are not as high so that the probability of damaging sensitive samples is lessened.

The method of one embodiment of the invention comprises: providing a sample of a material having a characteristic energy value; directing an electron beam having a width appropriate for parallel multi-pixel imaging to be incident on the sample; and maintaining a stable electrostatic charge balance of the sample. (A 'pixel,' or picture element, is defined by the projected size of the image on an element of an electron detector.) One application of SEEM is the detection of defects in the manufacture of semiconductor devices. Another is for investigating other materials, including biological samples and tissues.

The electrons emitted from the sample are focused by a projection electron lens to an image plane and detected by an electron detector, which is preferably a time delay integrating (TDI) electron detector. The operation of an analogous TDI optical detector is disclosed in U.S. Pat. No. 4,877,326 to Chadwick et al, which is incorporated herein by reference. The image information may be processed directly from a 'back thin' TDI electron detector, or the emitted electrons may be converted into a light beam and detected with an optional optical system and a TDI optical detector.

The present invention overcomes many of the problems associated with prior art approaches to using electron beams for investigating sample surface structures by combining certain features of the LEEM and SEM techniques. Compared to the conventional Scanning Electron Microscope method of raster scanning an object, the invention utilizes a relatively wide beam of electrons to parallel-image the object. Essentially, a relatively wide beam of primary electrons is used as in LEEM, but the energies of these electrons are characteristic of those used in SEM. By operating the primary electron beam near energy $E_2$ at a stable point on the yield curve of the sample material, the present invention realizes the unexpected advantage of eliminating the problem of charge build up on the sample surface associated with LEEM. The charge build-up on the surface of the object is controlled by directing the electron beam onto the object surface at an electron energy where the number of emitted secondary electrons equals the number of incident primary electrons.

SEEM is much faster than SEM because SEEM does not scan a narrow beam across the sample, but instead directs a relatively wide beam of electrons at the surface. To put this in numerical perspective, the spot size of the scanning beam in Scanning Electron Microscopy (SEM) is typically about 5 nanometers to 100 nanometers ($5 \times 10^{-9}$ meters to $100 \times 10^{-9}$ meters). The spot size of the incident beam in Secondary Electron Emission Microscopy (SEEM) is about one millimeter to ten millimeters ($1 \times 10^{-3}$ meters to $10 \times 10^{-3}$ meters). Thus, the spot size in SEEM is on the order of ten thousand to one million times larger than in SEM. Accordingly, SEEM is able to look at a larger surface more rapidly than is possible in SEM.

The primary electron energies in SEEM are close to the $E_2$ point used in SEM, i.e. about 1–2 keV (one thousand electron volts). In LEEM, the primary electron energies are in the range of 0–100 eV below the $E_1$ point for the material. Thus, the surface charges negatively.

The comparative speed advantage in SEEM, i.e. the maximum pixel rate, is limited mainly by the 'dwell time' and the 'current density.' The minimum dwell time that a beam must spend looking at a given image is determined by the acceptable Signal-to-Noise ratio of the image. The maximum current density is determined by such practical considerations as available gun brightness and possible sample damage. Because the focused beam of primary electrons in SEM must scan the beam across the entire surface to be inspected, the maximum practical pixel rate in Scanning Electron Microscopy is less than or equal to 100 million pixels/second (100 MHz). In Secondary Electron Emission Microscopy (SEEM), a large two-dimensional area of the sample is imaged in parallel without the need for scanning. The maximum pixel rate in SEEM is greater than 800 million pixels/second (800 MHz). The dwell time of the beam in SEEM may correspondingly be much longer than in SEM, and this permits a much lower current density while still maintaining a high Signal-to-Noise ratio. Thus, SEEM has the capability of investigating more sensitive sample surface structures while requiring lower brightness electron beam sources.

BRIEF DESCRIPTION OF THE DRAWINGS

FIG. 3 is a chart comparing the SEEM technique of the invention to prior art electron beam inspection techniques;

FIG. 5 illustrates the imaging method of SEEM for comparison with FIG. 4;

FIG. 6(*b*) shows how the electron beam of SEEM inspects metal lines connecting vias.

DETAILED DESCRIPTION OF THE PREFERRED EMBODIMENTS

Figure 1:
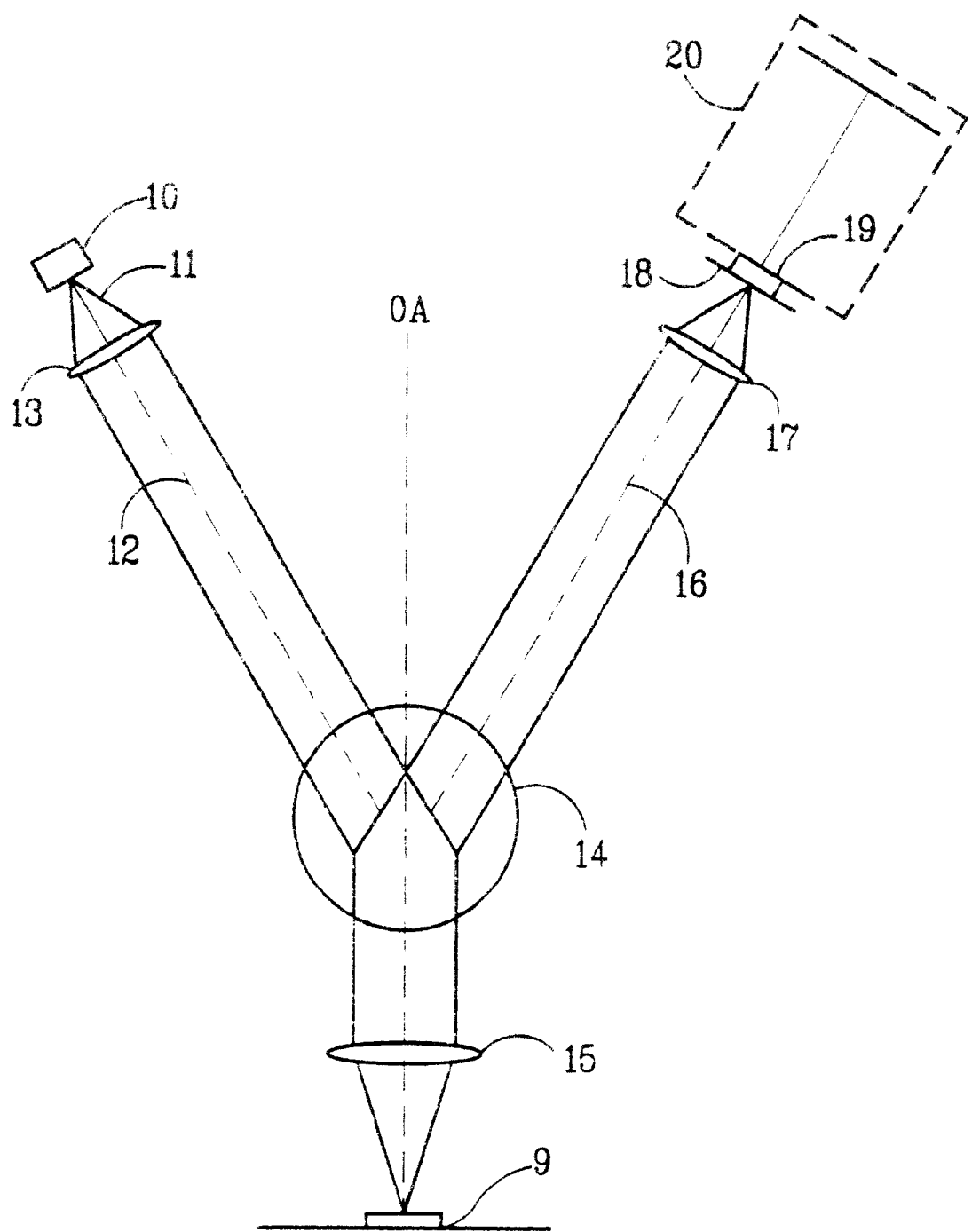
FIG. 1 illustrates the basic configuration of the SEEM apparatus of the present invention.

FIG. 1 shows the basic configuration for the Secondary Electron Emission Microscopy (SEEM) apparatus of the present invention. An electron gun source 10 emits a beam 11 of primary electrons $e_1$ along path 12. The electron beam 11 is collimated by electron lens 13 and continues along path 12. Magnetic beam separator 14 then bends the collimated electron beam 11 to be incident along electron optical axis OA normal to the surface to be inspected. Objective electron lens 15 focuses the primary electrons, $e_1$, into a beam having a spot size in the range 1–10 mm and an incident energy on the order of 1 keV on sample S.

Primary electrons $e_1$ incident on the sample S produce secondary electrons $e_2$ which travel back along the axis OA perpendicular to the inspection surface to objective electron lens 15, where they are recollimated. Magnetic beam separator 14 bends the electrons to travel along image path 16. The electron beam along image path 16 is focused by projection electron lens 17 to image plane 18, where there is an electron detector 19, which is a camera or preferably a time delay integrating (TDI) electron detector. The operation of an analogous TDI optical detector is disclosed in U.S. Pat. No. 4,877,326 to Chadwick et al, which is incorporated herein by reference. The image information may be processed directly from a 'back thin' TDI electron detector 19, or the electron beam may be converted into a light beam and detected with an optional optical system 20 and a TDI optical detector.

While the size of the electron beam spot on the sample S is preferably about one to two millimeters, it is more generally in the range of 0.1 to 100 millimeters. The size of this beam at the sample and imaging planes is optionally variable with a zoom imaging system to control the resolution and rate of acquiring the image. In any event, to eliminate edge effects, the beam width should be larger than, and preferably at least twice the characteristic dimension of, the detector at the image plane.

Figure 2:
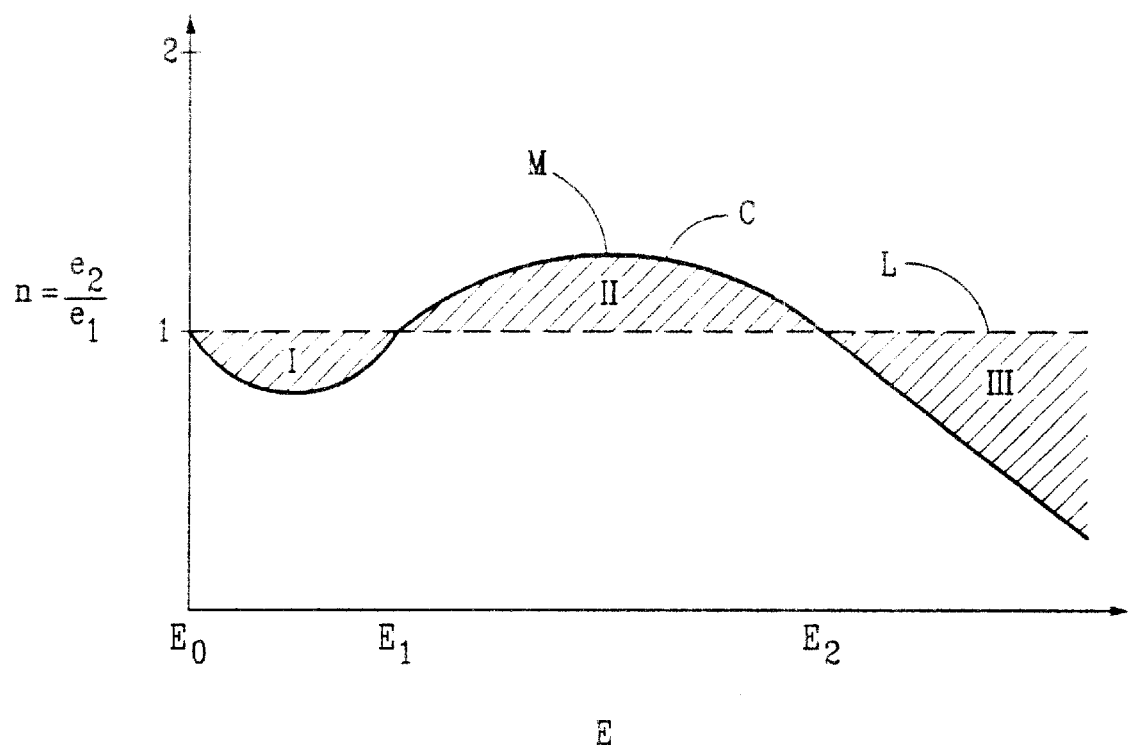
FIG. 2 is a graph of the relationship between the charge balance yield ratio and the primary electron energy.

FIG. 2 is a graph showing the yield ratio η versus primary electron energy characteristic of electron beam inspection techniques such as LEEM, SEM and SEEM. Yield ratio $\eta$ is defined as the number of electrons emitted by the surface, $e_2$, divided by the number of electrons incident on the surface, $e_1$. Yield ratio $\eta$ thus defines the amount of charge build-up on the surface being inspected since there will be a net charge build-up whenever $\eta$ does not equal unity. A yield ratio of greater than one implies that more electrons are being emitted than are incident, resulting in a net positive charge at the surface, and conversely a yield ratio of less than one indicates that more electrons are incident on the surface than are being emitted, resulting in a negative charge build-up.

Yield curve C indicates the experimentally-derived mathematical function that defines the yield ratio $\eta$ at various incident electron energies, F, for a typical sample substance. As shown in FIG. 2, line L is the line of charge balance $\eta=1$, and there are only three points on yield curve C where charge balance is achieved, i.e. $e_2/e_1=1$. These three points are $E_0=0$, $E_1$, and $E_2$. (Energy $E_0=0$ is uninteresting for present purposes since it represents a situation where no electrons are incident on the sample.) In region I, between line L and yield curve C, there is an excess of negative charge since $e_2$ is greater than $e_1$. In region II, between line L and yield curve C, there is an excess of positive charge since $e_1$ is greater than $e_2$, i.e. more secondary electrons are emitted than primary electrons are incident. In region III, between line L and curve C, the charge build-up again becomes negative.

One can see from FIG. 2 that on yield curve C there are only two significant points, $E_1$ and $E_2$, where there exists a charge balance. The problem is that only point $E_2$ is actually stable. That is, if the energy, $E_1$, of the primary electrons incident on the sample surface varies in either direction from $E_1$ by a small amount, the charge balance is quickly lost. Charge balance $\eta$ becomes increasingly negative or increasingly positive depending upon whether $E_1$ was approached from the $+\Delta E_1$ or $-\Delta E_1$ direction. Point $E_1$ is unstable because the slope of curve C is positive at this point. However, point $E_2$ is stable because the slope is negative there. Any variation in incident electron energy from $E_2$ in the direction of either $+\Delta E_2$ or $-\Delta E_2$ tends to return the beam energy to point $E_2$. The values of $E_1$ and $E_2$ have been experimentally determined for a variety of substances, such as silicon dioxide, aluminum, and polysilicon. While each substance has its own characteristic yield curve C, the general shape of these yield curves is as shown.

FIG. 2 illustrates graphically the problem with past techniques of electron beam inspection, and shows why the present SEEM technique provides unexpected advantages. Low Energy Electron Microscopy (LEEM) generally operated below $E_1$, with electron energies of 100 eV or less. Since point $E_1$ is unstable, LEEM suffered from the problem of charge build-up. Scanning Electron Microscopy (SEM) operated just below $E_2$, with electron energies in the range of 1–2 keV. Because point $E_2$ is stable, there was no problem with charge build-up in SEM, but SEM is slow precisely because it requires scanning. Prior to the present invention, it is believed that none had thought to drive the relatively wide beam of the LEEM parallel imaging system at energy $E_2$, as is recognized by the SEEM technique of the invention. The SEEM technique of the present invention is therefore the first recognition of the advantages of combining the parallel imaging of LEEM with the charge balance of SEM.

It is important to note that for purposes of FIG. 2 the primary electron energy is to be measured at the surface of the sample S. The energy of the electrons focused by objective electron lens 15 is generally different than the energy of the electrons at the sample S, called the landing energy, and this landing energy is often not easy to predict. The landing energy may depend on factors such as the current density of the beam, the material of the sample and the electric field at the surface.

The landing energy of the primary electrons is chosen as approximately $E_2$, but generally somewhere below $E_2$ on yield curve C. FIG. 2 shows that yield curve C has a relative maximum in region II at point M. Generally, one chooses a landing energy for the electrons between point M and the $E_2$ value on yield curve C. In the case where the sample S includes a plurality of materials the $E_2$ value and yield curve C are different for each of the materials. When there are a plurality of materials in sample S, one chooses a landing energy below the $E_2$ values of each of the plurality of materials so that the landing energy is not in the more charging regions III for any of the materials.

FIG. 3 is a chart summarizing the differences between, and advantages of, the four PEEM, LEEM, SEM and SEEM techniques. PEEM uses photons instead of primary electrons to produce emitted secondary electrons. PEEM suffers from the problem of positive charge build-up on insulating sample target materials because secondary electrons are being knocked off the sample surface by the photons, but no negatively charged particles replace these secondary electrons. The inspecting photon beam of PEEM can be wide, and parallel imaging can be achieved.

In Low Energy Electron Microscopy (LEEM), a wide beam of primary electrons is projected at the inspection surface, and parallel imaging can be achieved. These primary electrons are relatively low in energy, and the imaging method involves reflecting these low-energy electrons from the surface. Because only low energy electrons are incident, primary electrons are reflected but few secondary electrons are emitted. Also, the low energy implies a negative charge build-up because these electrons are not sufficiently energetic to escape the sample surface.

In Scanning Electron Microscopy (SEM), relatively slow raster scanning imaging must be utilized because the electron beam is focused to a narrow spot size. SEM, however, produces energetic primary source electrons incident at energy $E_2$, which is a stable point on the yield curve, so that charge-neutral operation is attained. Energetic primary electrons produce secondary electrons in SEM.

In the Secondary Electron Emission Microscopy (SEEM) technique of the present invention, a beam of energetic primary electrons is directed at the sample surface with an energy $E_2$. Because a relatively wide beam of primary electrons is introduced, parallel imaging becomes possible, which is significantly faster than SEM imaging. Moreover, since these primary electrons are incident with an energy $E_2$, the sample remains charge neutral. SEEM thus combines the most favorable attributes of LEEM and SEM.

Figure 4:
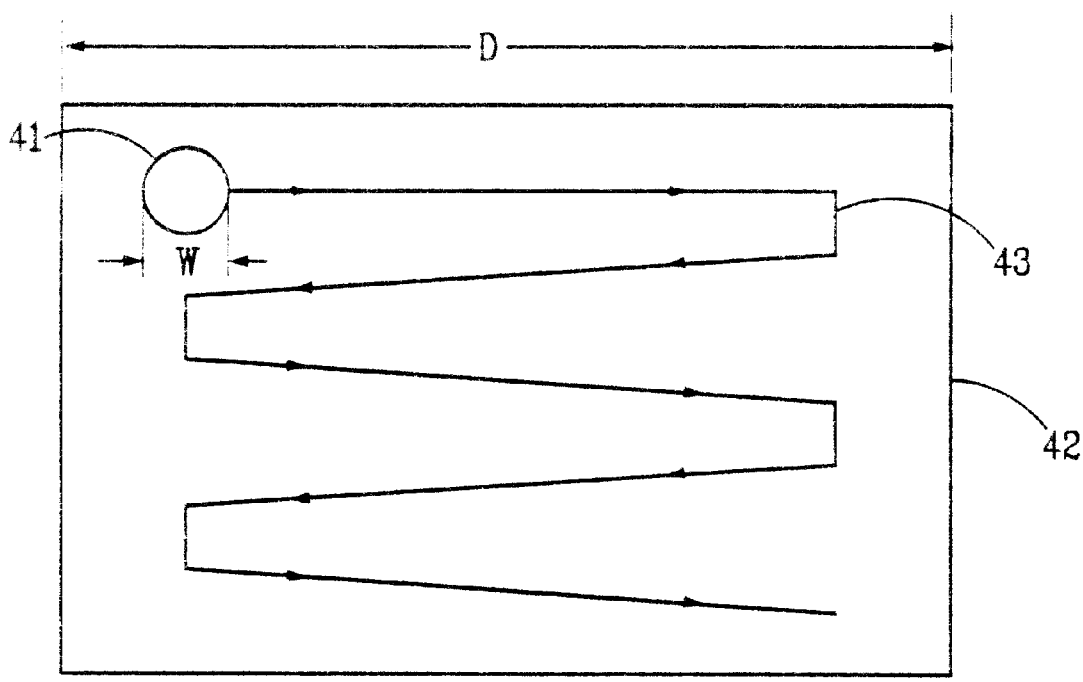
FIG. 4 illustrates the imaging method of SEM.

FIGS. 4 and 5 comparatively illustrate the respective imaging methods of Scanning Electron Microscopy and Secondary Electron Emission Microscopy. In FIG. 4, a Scanning Electron Microscope produces a beam 41 of electrons and directs them at the surface of sample 42 having a characteristic dimension D. Beam 41 has a width "w," which is in the range of 5 to 100 nanometers (50–1000 Angstroms). This beam 41 is raster-scanned in a pattern represented by path 43 across the surface of sample 42. (The number of scan lines is greatly reduced for purposes of illustration.) In order to control the beam 41 so that it travels along raster path 43, it is preferred for the inspection system to include an electron beam steering apparatus for electro-magnetically deflecting the electron beam 41.

FIG. 5 shows parallel imaging in the Secondary Electron Emission Microscopy inspection technique of the present invention. Beam 54 is produced from an electron gun source, and beam 54 has a width "W," typically about one to two millimeters, at the surface of sample 55. Sample 55 has the characteristic dimension D, which is much greater than the width W of the electron beam. In SEEM, the width of the electron beam 54 is much larger than in SEM, but it may still be necessary to move the sample 55 with respect to the beam to scan the sample 55. However, in the preferred embodiment, SEEM requires only mechanical movement of the stage of the sample 55 with respect to beam 54, and not an electron beam deflection system for electromagnetically steering beam 41. The SEEM inspection system of the present invention can operate much faster than the SEM inspection system because SEEM images thousands or millions of pixels in parallel.

FIG. 5 further shows a magnified view of the imaging portion of the beam 54 on the sample 55 to illustrate the parallel, multi-pixel imaging region 56 within beam 54. A rectangular detector array region 56 occupies a central portion of the beam 54 and defines the imaging aperture. (The detector array is either of the time delay integrating (TDI) or non-integrating type.) The detector array 56 images between about 500 thousand and one million pixels in parallel.

SEEM is therefore 500 thousand to one million times faster than SEM due to the number of pixels in the detector array. If SEEM spends one millisecond looking at a pixel, SEM can only take one or two nanoseconds for that pixel to capture the same data frame at 100 MHz. Accordingly, the current density at the sample surface in SEEM is $10^6$ (i.e. one million) times smaller than in SEM, which results in less damage to the sample. If, say, 10,000 electrons per pixel are required for a good image, SEM must pour a larger number of electrons per unit time onto the pixel spot. In SEEM, the same number of electrons are spread out over a longer time because one million pixels are imaged simultaneously.

It further follows that SEEM has better noise reduction characteristics than SEM. At 100 MHz, SEM samples each pixel for one nanosecond while SEEM spends one millisecond looking at each pixel. SEEM, therefore, averages out noise above one kHz, while SEM can only average out noise above 100 MHz. In defect detection applications, this implies fewer false positives and a better signal-to-noise ratio.

SEEM obtains additional advantages in charge control by flooding the sample 55 with beam 54, but imaging only the central portion of the beam 54 to eliminate edge effects. Ordinarily, non-uniformities in charge on the imaging surface lead to imaging distortions by deflecting the beam. The sample surfaces at the edge of the beam 54 have less uniform charge distributions than the surfaces at the interior portion of the beam because there is no electron flux outside the circumference of the beam diameter. There are further edge effects because of the residual charging in areas the beam has already scanned. By flooding an area 54 larger than the imaging area of the detector array region 56, these imaging distortions are avoided. In SEM, edge effects cannot be eliminated by this method because the beam diameter is too small for further aperturing. Techniques for reducing the effect of surface charge accumulation are taught in U.S. Pat. No. 5,302,828 to Monahan, which is hereby incorporated by reference.

The present invention optionally may include additional means for maintaining the charge balance at the sample. While the electron beam energy is generally chosen to approximately maintain this charge balance, in actual practice solely controlling the electron beam energy may not be sufficient. One possibility is to apply a supplemental electric field by attaching electrodes to the sample. A variable voltage control feeds current to the electrodes thereby supplying an additional degree of freedom towards charge balance stability. Another possibility is to introduce a low pressure gas, such as argon, into the vacuum chamber which contains the sample to control the charge balance. The low pressure gas may act to prevent the accumulation of excess charge on the sample. While the above techniques are exemplary of additional control means for maintaining the charge stability of the sample, they are by no means all-inclusive, and other such techniques may exist or be subsequently discovered to regulate charge control.

Any of these additional charge control means optionally may be utilized with the flooding method of Monahan, supra. The use of an electron beam of a particular energy with respect with the $E_2$ value of the material acts as a first order approximation to maintaining a stable charge balance. The use of additional charge control means such as flooding, electrodes, and/or low pressure gas acts a second order approximation to maintaining this charge balance. The combination of these first and second order charge control means may optionally be required for a practical charge control apparatus.

It is useful to compare the limitations imposed by the maximum scan rate in SEEM and SEM. To summarize the advantages of SEEM over SEM:

(1) Lower Noise.

A longer image integration time is obtained for a given sample area. Averaging over longer sampling times results in less noise.

(2) Less Image Distortion.

By flooding a larger area on the sample than is imaged, a more uniform charge distribution is maintained for the imaged area, and edge effect distortion is eliminated.

(3) Lower Current Densities.

Lower current densities, made possible by parallel imaging and greater dwell times, imply that there is a reduced probability of damage to the sample.

(4) Faster.

Parallel imaging means that many pixels (e.g. one million) are imaged at the same time in SEEM. Only one pixel is imaged at one time in SEM.

(5) No High Speed Scanning Electronics.

These scanning systems are complex and expensive, but are not required in SEEM because of faster parallel imaging.

Figure 6A:
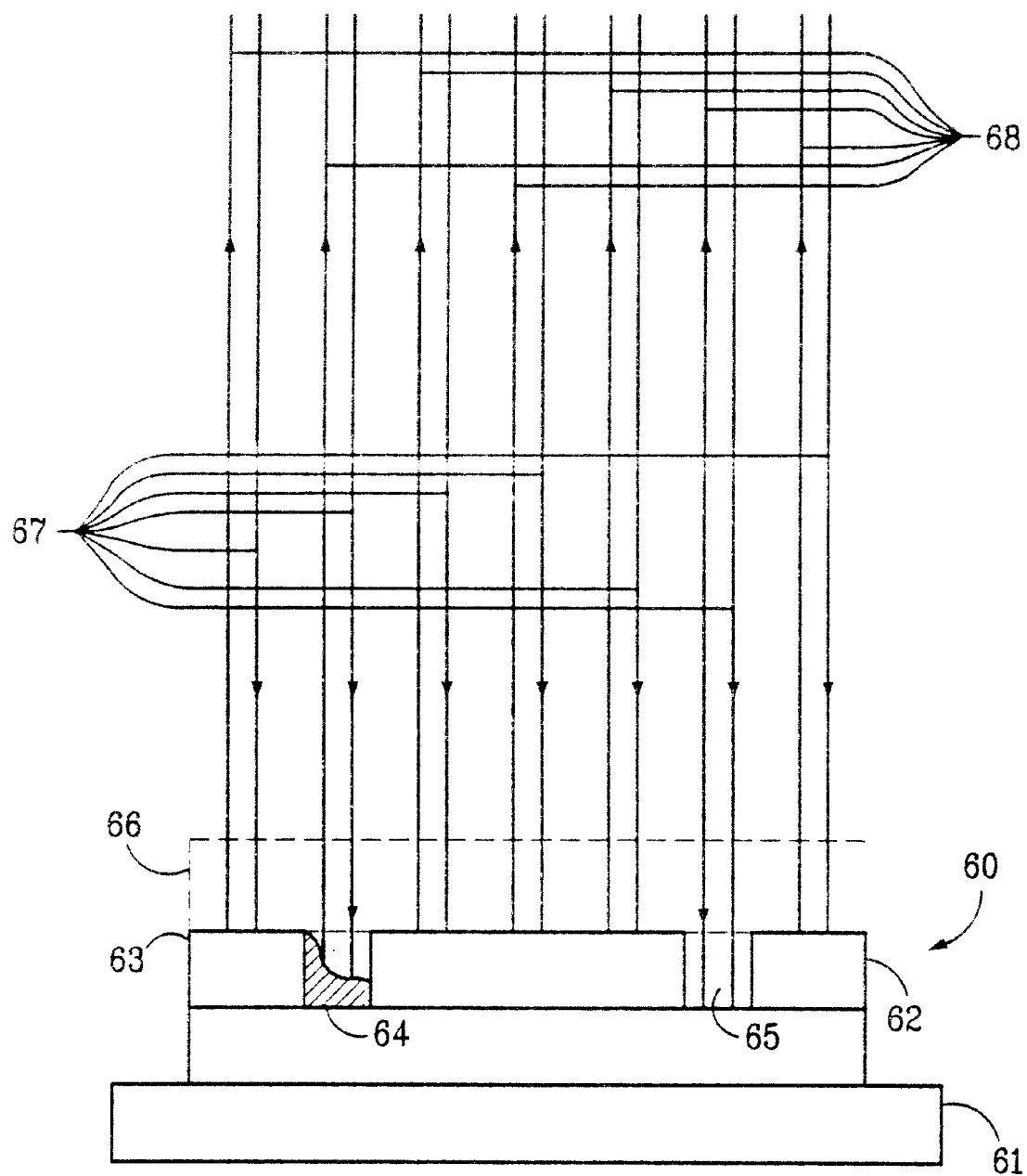
FIG. 6(*a*) shows how the electron beam of SEEM detects a defect (an obstruction) in a via of an insulating layer.

FIG. 6(a) illustrates how an electron beam of the present invention detects defects in a via between the layers of a semiconductor device. An intermediate stage of fabrication of semiconductor device 60 is shown. In this example, semiconductor device 60 consists of a substrate 61, a metal layer 62 deposited on substrate 61, and an insulating layer 63 formed over metal layer 62. Vias or holes 64, 65 are shown extending through insulating layer 63 to metal layer 62. At a subsequent stage of fabrication, a second metal layer 66 is formed over insulating layer 63, and vias 64, 65 are filled with an electrically conductive material to form electrical connections between metal layers 62 and 66. At the present stage of fabrication, however, metal layer 66 has not yet been deposited, so it is only shown in dotted lines. Generally speaking, vias 64 and 65 are formed by etching insulating layer 63. Via 64, however, is here shown to be clogged while via 65 is clear. Via 64 may, for example, become clogged with foreign material, or it may be clogged because of imperfections in the etching process. In either event, via 64 represents a defective via. while via 65 represents a perfect via.

FIG. 6(a) further shows a beam 67 of primary electrons incident normal to the surface of semiconductor device 60 onto insulating layer 63. Because layer 63 is an insulating material, electron mobility on layer 63 is limited. Insulating layer 63 therefore has a tendency to collect charge on its surface, and this has led to the charge build-up problems associated with prior art inspection techniques such as LEEM. However, in the Secondary Electron Emission Microscopy (SEEM) technique of the present invention, the energy of the electrons in beam 67 is chosen to be sufficiently near the $E_2$ value of the material of insulating layer 63. Thus, upon illumination by primary electron beam 67, a secondary electron beam 68 is produced by insulating material 63 with minimal build-up of charge on surface 63 of the material. Secondary electron beam 68 is emitted in a direction normal to the surface of insulating layer 63, and in a sense opposite to primary electron beam 67. Secondary electron beam 68 contains information about the defective and perfect vias 64, 65, and this information passes back through the optical system, is detected and subsequently processed to enable the operator to determine whether the semiconductor device 60 is defective.

Figure 6B:
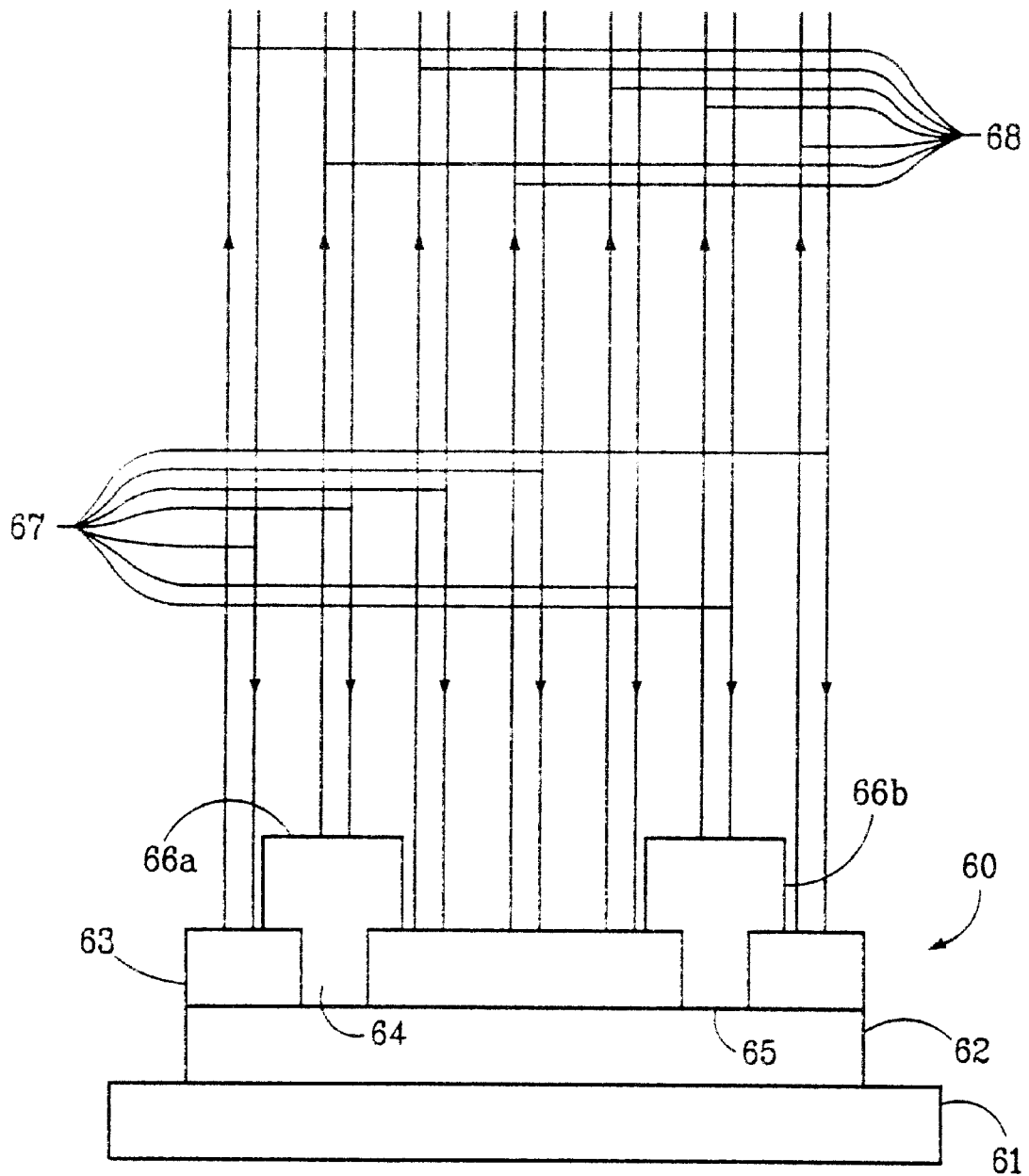

FIG. 6(b) shows electron beam inspection of the semiconductor device 60 of FIG. 6(a) at a subsequent stage of construction. Metal lines 66a and 66b extend in a direction perpendicular to the page to connect metal layer 62 through vias 64, 65, thereby providing electrical contact between lines 66a, 66b and layer 62. Primary electron beam 67 is incident on semiconductor device 60, and particularly on metal lines 66a, 66b and insulating layer 63. Inspective imaging of the surface of metal lines 66a, 66b and insulating layer 63 is achieved with the charge differential information encoded on secondary electron beam 68.

Process control monitoring for the semiconductor industry is thereby improved with electron beam inspection of the present invention as compared with optical beam inspection by reducing or eliminating false positives due to grain structures and color noise. Once a defect has been identified, it may be repaired with a procedure such as focused ion beam implantation if the defect is critical.

More generally, the secondary electron emission microscope of the present invention is used to inspect defects in any semiconductor device, thin film magnetic head, reticle for semiconductor fabrication or flat panel (e.g., liquid crystal or field effect) display. Insulating, semiconducting, or conducting materials, or even superconductors and plasmas, are capable of being imaged with SEEM. A typical semiconductor fabrication process involves ultraviolet reduction projection of a reticle pattern produced for a wafer design, followed by chemical etching for each of the device layers. Alternatively, semiconductor devices are patterned with ion beams or etching, or by other CMP processing. Process inspection and monitoring of the intermediate and final products is then performed with the method of the present invention.

Figure 7:
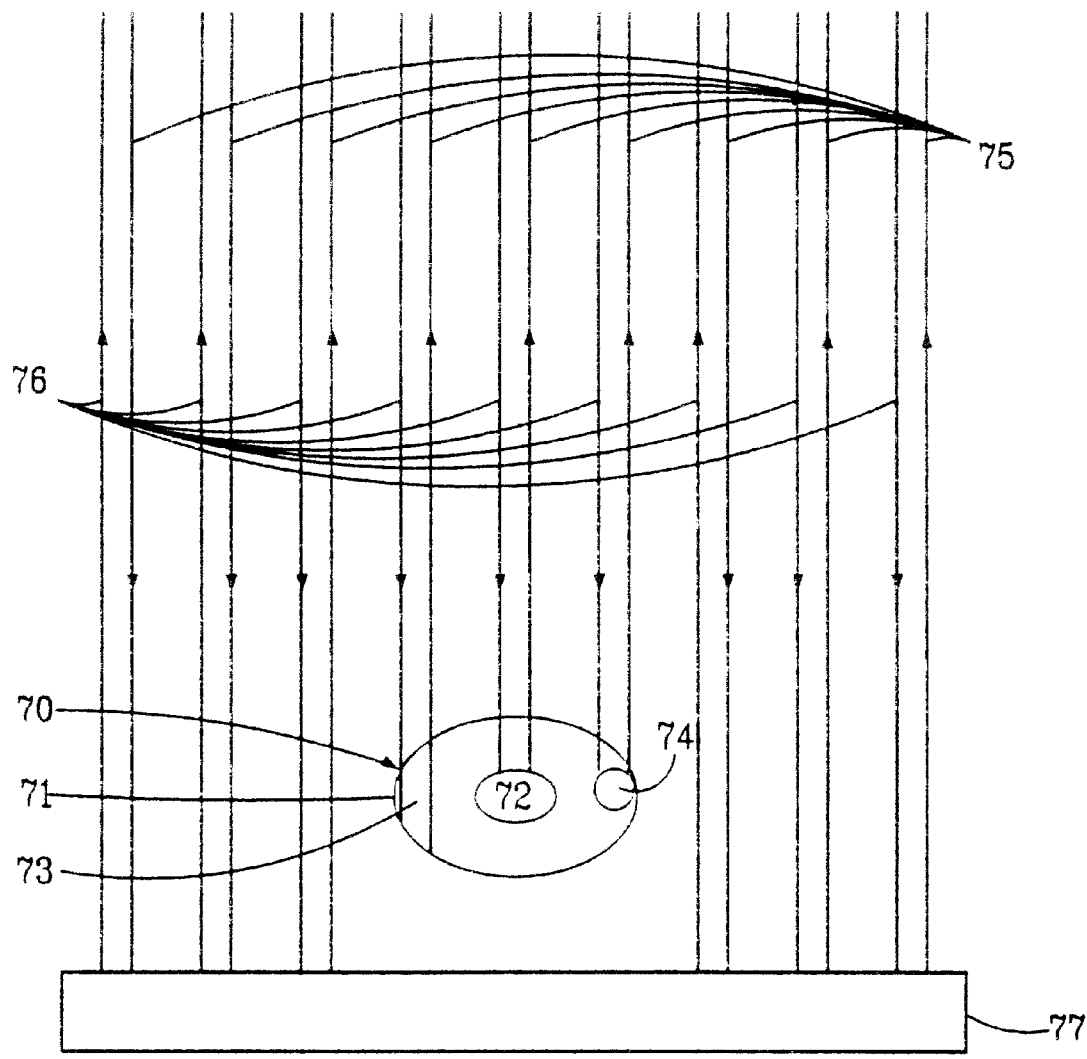
FIG. 7 shows how the electron beam of SEEM is used to study biological samples.

FIG. 7 illustrates how the Secondary Electron Emission Microscope (SEEM) of the present invention is applied to studying a biological sample 70 on a stage carrier 77. Biological sample 70 has various features 71, 72, 73, and 74. For example, sample 70 may be a cell including a cell wall 71, a cell nucleus 72, protoplasm 73 and mitochondrion 74. Or, sample 70 may be human tissue including muscle 71, bone 72, fluid 73 and malignant cells 74. A beam 75 of primary electrons is incident normally on sample 70. Beam 75 has a landing energy just below the mean $E_2$ values characteristic of the materials of cell 70 in order to prevent charge build-up on cell 70. A beam 76 of secondary electrons is produced upon illumination of cell 70 with beam 75, and beam 76 passes normally back through the electron optical system. Information about cell 70 is encoded in beam 76 and is detected and processed to obtain information about cell 70.

While the present invention has been described above in general terms, it is to be understood that the apparatus and method of the present invention could be adapted to a variety of applications. Accordingly, it is intended that the present invention cover all such adaptations, alterations, modifications and other applications as fall within the scope of the following claims.

We claim:

1. A method of inspecting a sample, comprising:

directing a primary electron beam containing a first group of electrons to be incident on an area of the sample including a plurality of pixels such that electrons are simultaneously emitted from each of the plurality of pixels;

directing a second group of electrons to be incident on the area of the sample such that the first group of electrons and the second group of electrons act together to maintain a stable electrostatic charge on the sample; and using a sensor to detect any emitted electrons by simultaneously imaging the emitted electrons from the area of the sample.

2. The method according to claim 1 wherein said primary electron beam has a width greater than about 0.1 millimeters.

3. The method according to claim 1 wherein said sensor is operated in time delay integration mode.

4. The method according to claim 1 wherein the step of using a sensor further comprises parallel multi-pixel imaging.

5. The method according to claim 1 wherein the step of using a sensor further comprises simultaneously detecting secondary electrons on a plurality of pixels.

6. The method of claim 1 wherein the sensor has between approximately 500,000 and 1,000,000 pixels.

7. The method of claim 1 wherein at least one of said first group of electrons or said charge control means acts on an area larger than a portion of said area which is imaged.

8. A method of inspecting objects, comprising:

providing a sample;

directing an electron beam containing a first group of electrons to be incident on a multi-pixel imaging region of the sample;

directing a second group of electrons to be incident on the region of the sample, wherein the first group of electrons and the second group of electrons act together to maintain a stable electrostatic charge on the sample; and simultaneously detecting electrons emitted from a plurality of pixels within the multi-pixel imaging region.

* * * * *